(12) United States Patent
Schwan (10) Patent No.: US 12,107,363 B2
(45) Date of Patent: Oct. 1, 2024

(54) SEAL FOR AN ELECTRICAL PLUG CONNECTOR AS WELL AS ELECTRICAL PLUG CONNECTOR AND ELECTRICAL PLUG CONNECTION ASSEMBLY WITH SUCH A SEAL

(71) Applicant: TE Connectivity Germany GmbH, Bensheim (DE)

(72) Inventor: Ralf Schwan, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 17/691,393

(22) Filed: Mar. 10, 2022

(65) Prior Publication Data
US 2022/0294153 A1 Sep. 15, 2022

(30) Foreign Application Priority Data

Mar. 10, 2021 (DE) .......................... 102021105716.7

(51) Int. Cl.
*H01R 13/52* (2006.01)

(52) U.S. Cl.
CPC ..... *H01R 13/5205* (2013.01); *H01R 13/5221* (2013.01)

(58) Field of Classification Search
CPC ............ H01R 13/5205; H01R 13/5221; H01R 13/5208; H01R 13/521; B60L 53/16
See application file for complete search history.

(56) References Cited

U.S. PATENT DOCUMENTS

| 5,820,395 A | 10/1998 | Hashizawa |
| 6,203,348 B1 | 3/2001 | Fukuda |
| 8,192,216 B1 | 6/2012 | Puluc et al. |
| 9,461,399 B2 | 10/2016 | Seelig et al. |
| 10,177,486 B2 * | 1/2019 | Kobayashi ......... H01R 13/5208 |
| 10,833,458 B2 * | 11/2020 | Sarraf ...................... G01K 1/18 |
| 2007/0099497 A1 | 5/2007 | Agethen et al. |
| 2014/0106616 A1 | 4/2014 | Devries et al. |
| 2020/0067237 A1 | 2/2020 | Sarraf et al. |
| 2021/0044053 A1 | 2/2021 | Aoki et al. |

FOREIGN PATENT DOCUMENTS

| CN | 101478080 B | 7/2009 |
| DE | 10142195 A1 | 4/2003 |
| DE | 10 2016 107 401 A1 | 8/2017 |

(Continued)

OTHER PUBLICATIONS

Examination Report from the Intellectual Property Office (India) dated Oct. 3, 2022 corresponding to Application No. 202244012062, 5 pages.

(Continued)

*Primary Examiner* — Vanessa Girardi
(74) *Attorney, Agent, or Firm* — Barley Snyder (57) ABSTRACT

A seal for an electrical plug connector includes a passage opening receiving a contact element, a contact sealing section extending along the passage opening in a sleeve-shaped manner, and a creepage distance increase section disposed opposite the contact sealing section. The creepage distance increase section continues the passage opening in a tubular manner and/or extends away from the passage opening in a plate-shaped manner.

16 Claims, 5 Drawing Sheets

(56) References Cited

FOREIGN PATENT DOCUMENTS

| | | |
|---|---|---|
| DE | 10 2018 208 214 A1 | 11/2018 |
| EP | 1 289 075 A2 | 3/2003 |
| EP | 3790120 A1 | 3/2021 |
| JP | H09161882 A | 6/1997 |
| JP | 200959586 A | 3/2009 |
| JP | 2010525533 A | 7/2010 |
| JP | 2020513670 A | 5/2020 |
| JP | 202098689 A | 6/2020 |
| JP | 202126933 A | 2/2021 |
| WO | 2008131868 A1 | 11/2008 |
| WO | 2018115085 A1 | 6/2018 |
| WO | 2020039344 A1 | 2/2020 |
| WO | 2020129338 A1 | 6/2020 |

OTHER PUBLICATIONS

German Office Action, Application No. 102021105716.7, Dated: May 16, 2022, 7 pages.
German Office Action, App No. 10 2021 105 716.7, dated Nov. 12, 2021, 9 pages.
Office Action from Japan's Patent Office dated Mar. 22, 2023 (with English Translation thereof), corresponding to Application No. 2022-034155, 7 pages.
Japanese Office Action dated Sep. 19, 2023 corresponding to Application No. 2022-034155, with English translation thereof, 9 pp.
Office Action from the German Patent Office dated Dec. 6, 2022, corresponding to Application No. 10 2021 105 716.7, 5 pages.
Korean Office Action dated Dec. 12, 2023 with English translation, corresponding to Application No. 10-2022-0029331, 10 pages.

* cited by examiner

SEAL FOR AN ELECTRICAL PLUG CONNECTOR AS WELL AS ELECTRICAL PLUG CONNECTOR AND ELECTRICAL PLUG CONNECTION ASSEMBLY WITH SUCH A SEAL

CROSS-REFERENCE TO RELATED APPLICATIONS

This application claims the benefit of the filing date under 35 U.S.C. § 119(a)-(d) of German Patent Application No. 102021105716.7, filed on Mar. 10, 2021.

FIELD OF THE INVENTION

The present invention relates to an electrical plug connector and, more particularly, to a seal for an electrical plug connector.

BACKGROUND

Plug connectors are used in numerous fields of technology to establish detachable connections for the transmission of electrical currents and/or signals. For reasons of electrical safety and for improved handling, the plug connectors each typically comprise a housing, from the interior of which electrically conductive contact elements emerge with which a mutual electrical contact of the plug connectors to be connected is established. In particular at the points where the contact elements pass through, there is a need to prevent moisture and/or dirt from penetrating into the interior of the housing.

Depending on the application, further components can additionally be disposed in the housing of the plug connector, such as electronic components of systems for operation monitoring and/or communication interfaces. They need to be effectively separated from the contact elements, as they typically have different electrical potentials.

SUMMARY

A seal for an electrical plug connector includes a passage opening receiving a contact element, a contact sealing section extending along the passage opening in a sleeve-shaped manner, and a creepage distance increase section disposed opposite the contact sealing section. The creepage distance increase section continues the passage opening in a tubular manner and/or extends away from the passage opening in a plate-shaped manner.

BRIEF DESCRIPTION OF THE DRAWINGS

The invention will now be described by way of example with reference to the accompanying Figures, of which.

DETAILED DESCRIPTION OF THE EMBODIMENT(S)

The invention shall be explained hereafter in more detail with reference to the drawings on the basis of several embodiments, the different features of which can be combined with one another as required. Similar, identical, and functionally identical elements in the drawings are provided with the same reference numerals as appropriate.

The schematic structure and use of a seal 1 according to the invention shall be explained below with reference to FIGS. 1 to 5. The schematic structure of an electrical plug connector 2 according to the invention shall be explained with reference to FIGS. 3 to 5. The schematic structure of an electrical plug connection assembly 4 according to the invention shall thereafter be described with reference to FIGS. 4 and 5.

Figure 1:
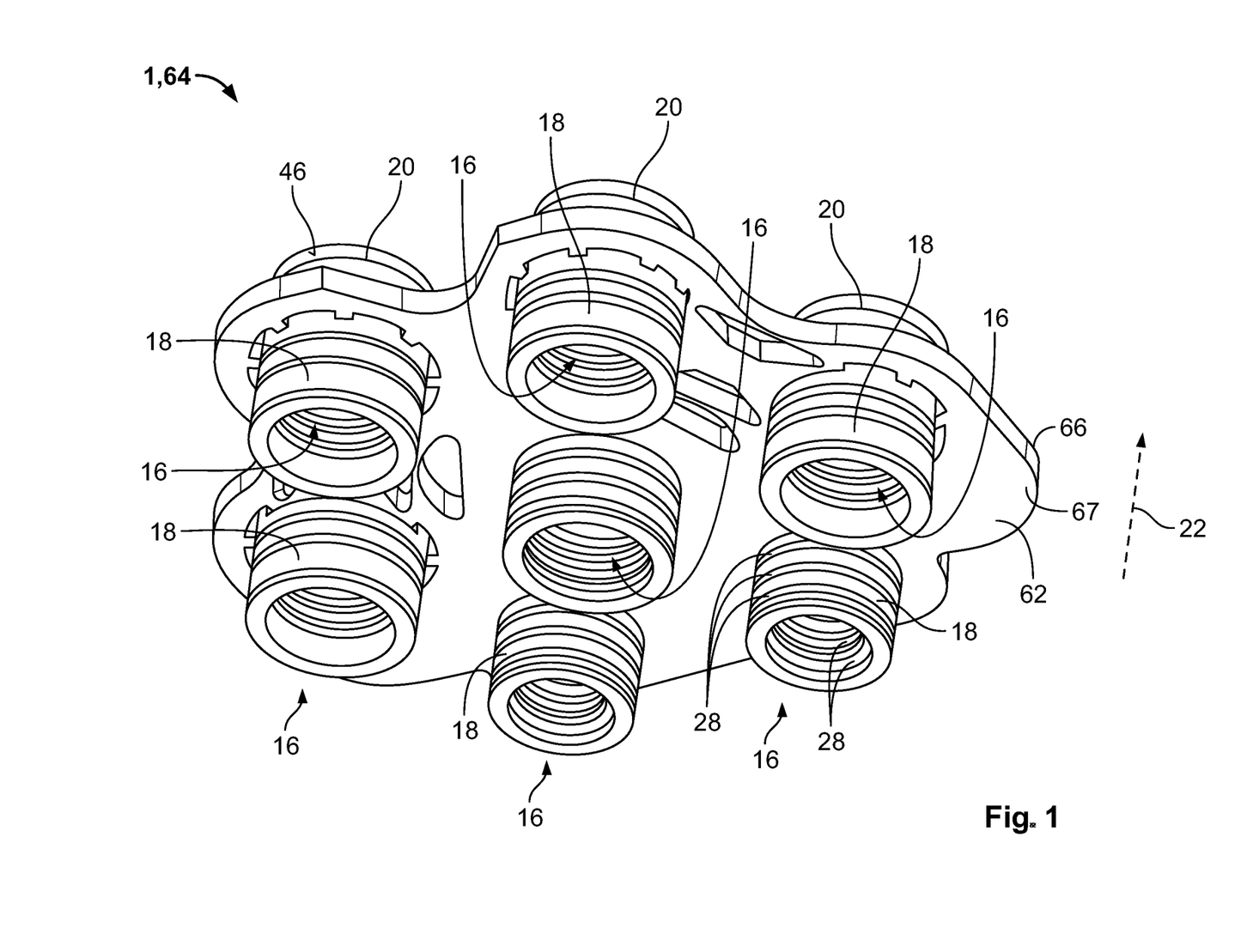
FIG. 1 is a perspective view of a seal according to a first seal embodiment.
Figure 2:
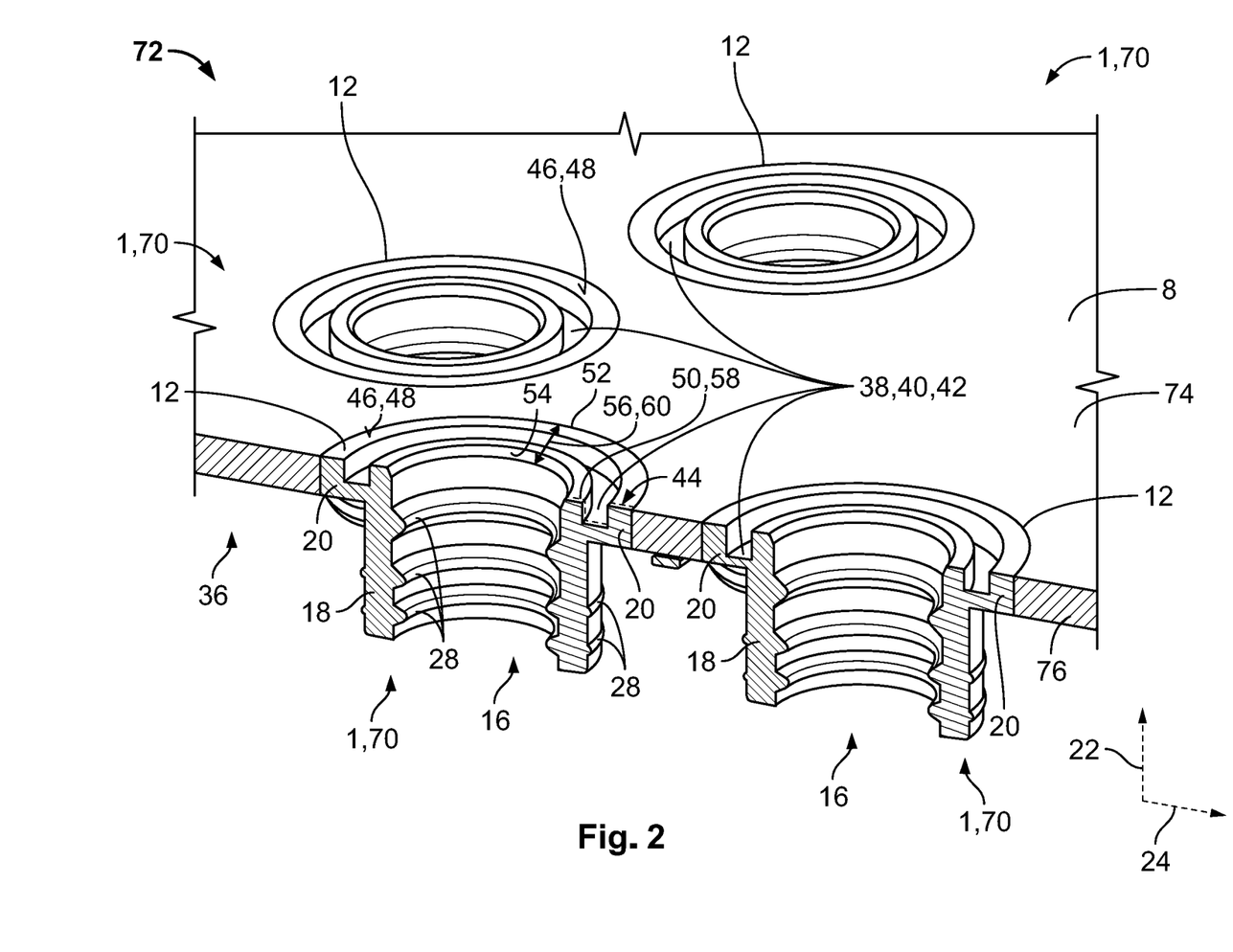
FIG. 2 is a sectional perspective view of a seal according to a second seal embodiment.
Figure 3:
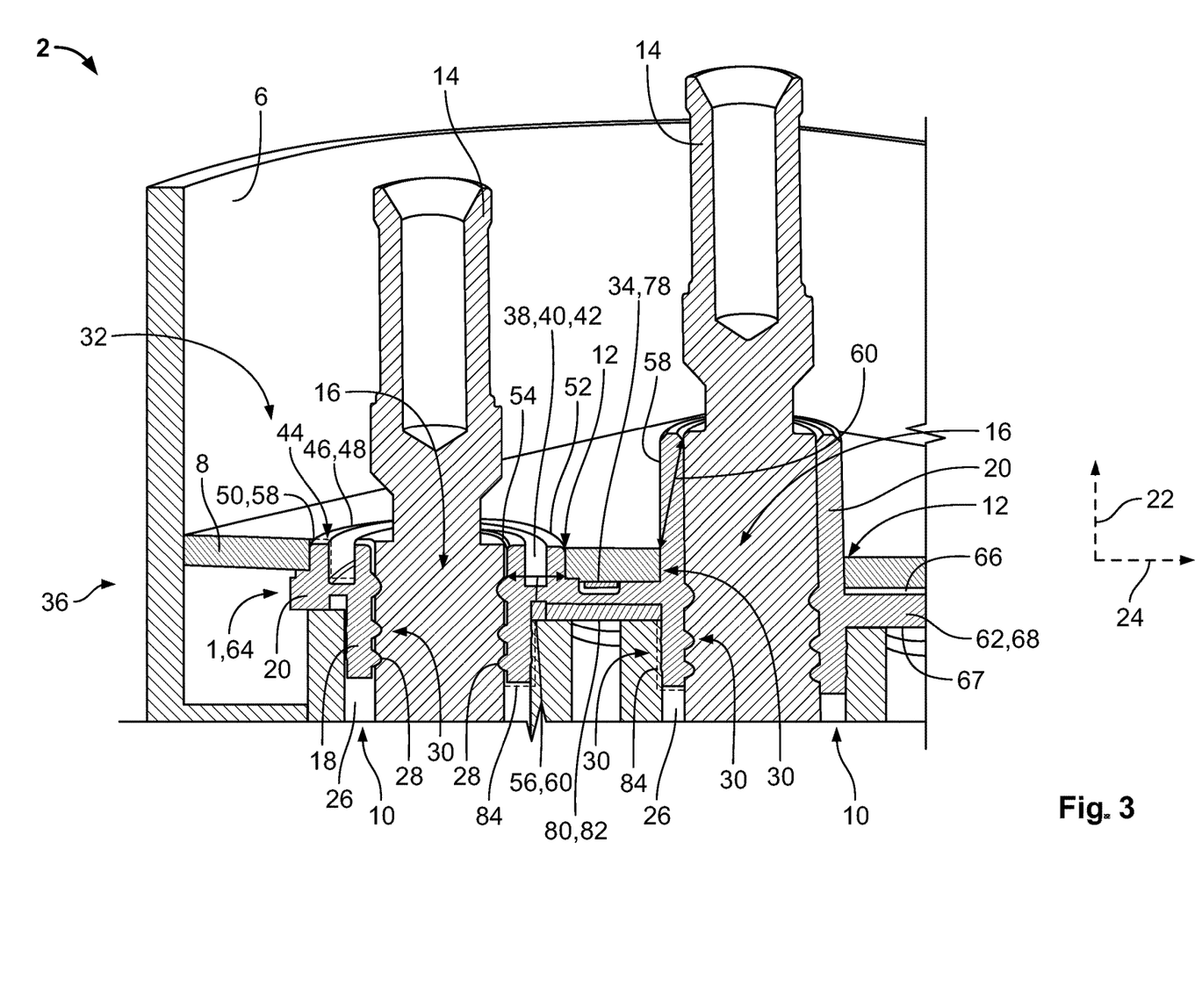
FIG. 3 is a sectional perspective view of an electrical plug connector according to an embodiment having the seals in the embodiments of FIG. 1 and FIG. 2.
Figure 4:
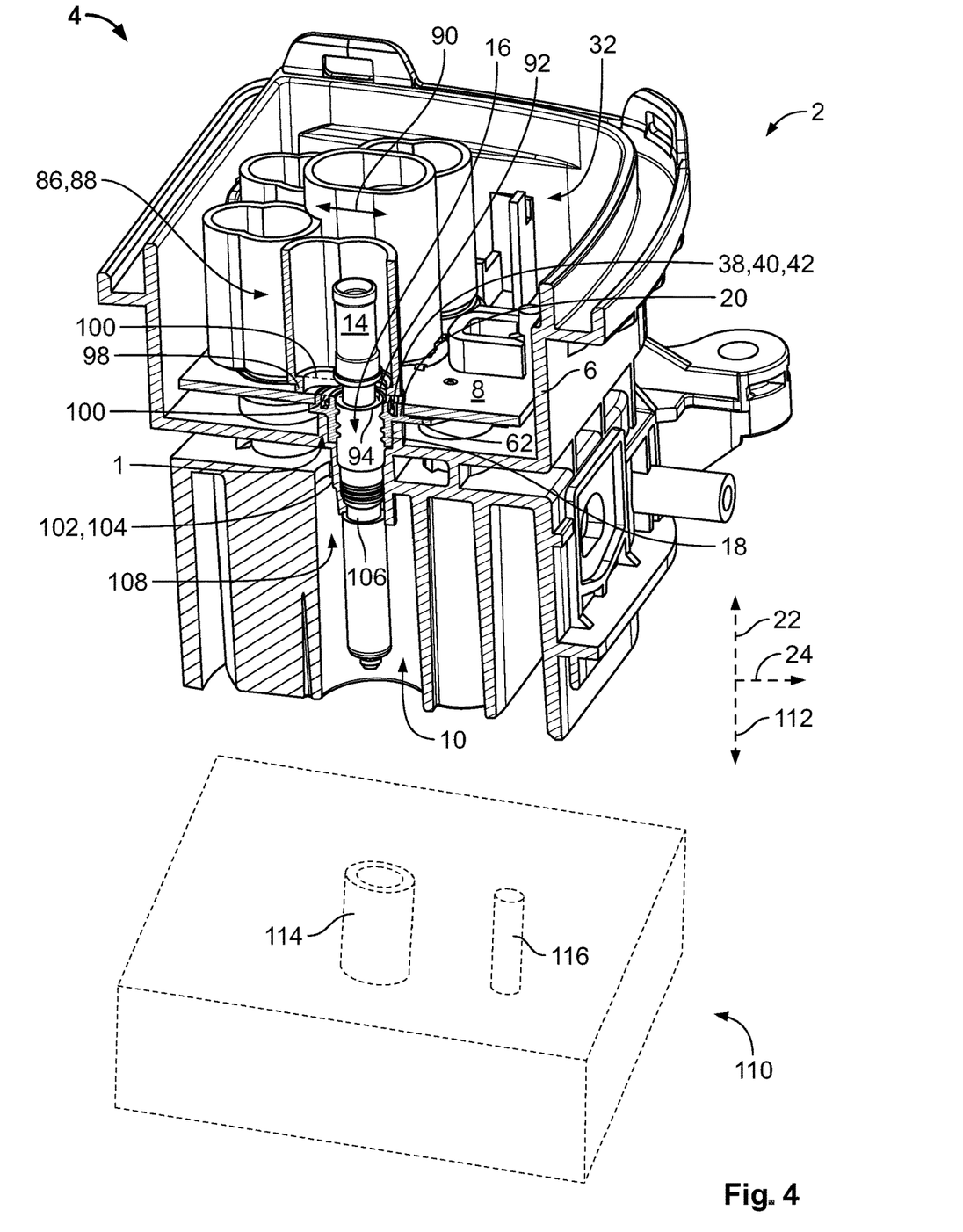
FIG. 4 is a sectional perspective view of an electrical plug connection assembly according to an embodiment having the seal of the embodiment of FIG. 2.
Figure 5:
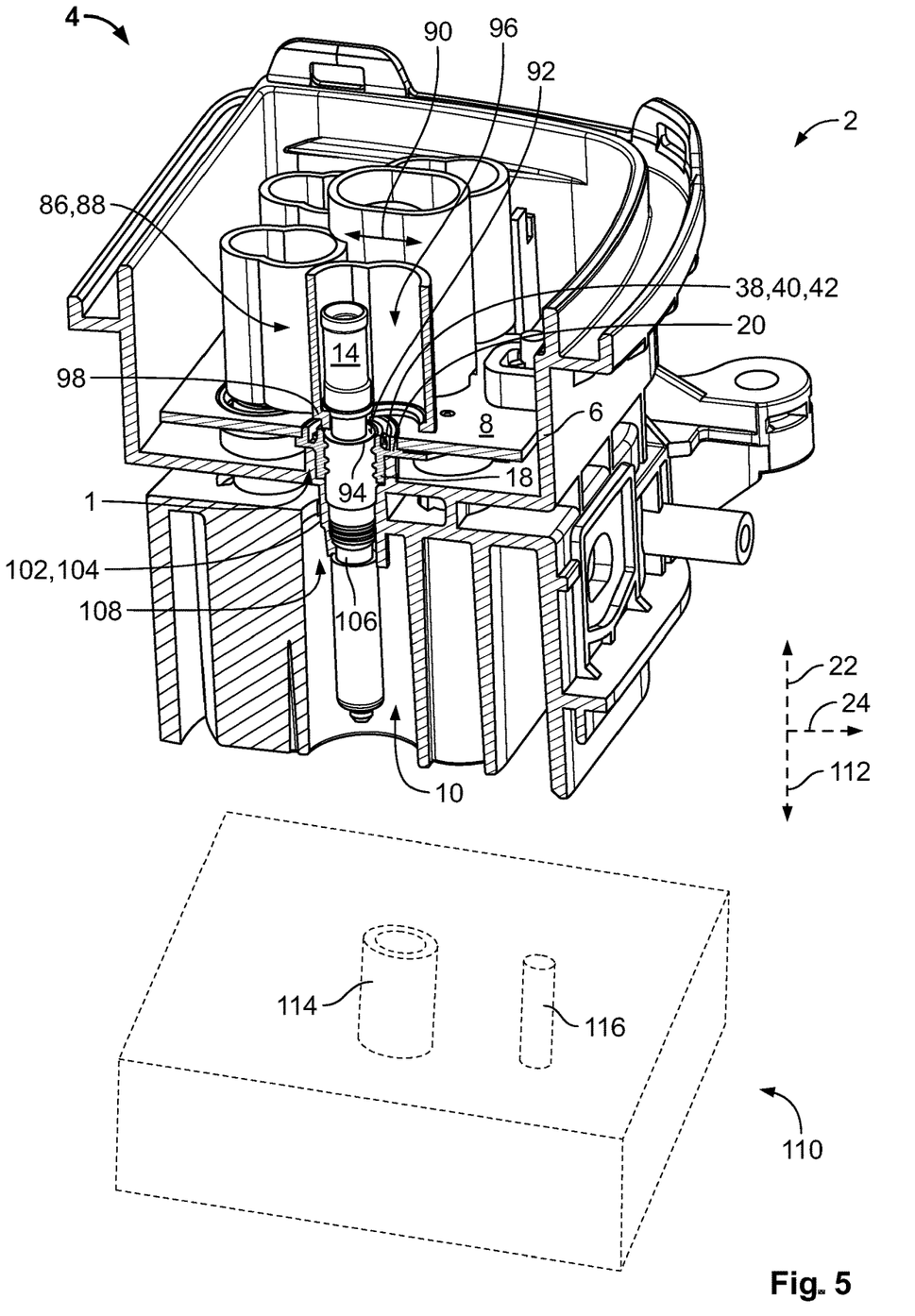
FIG. 5 is another sectional perspective view of the electrical plug connection assembly of FIG. 4 shown in another state.

FIGS. 1 and 2 each show exemplary embodiments of seal 1 according to the invention for electrical plug connector 2. FIGS. 3 to 5 show electrical plug connector 2 with seal 1 according to the invention, with a housing 6, with a circuit board 8 arranged in housing 6, and with at least one contact element 14 inserted into a contact chamber 10 of housing 6 and leading through a contact passage opening 12 of circuit board 8. FIG. 3 shows electrical plug connector 2 purely by way of example with two contact elements 14. Housing 6 from FIG. 3 accordingly purely by way of example there as well comprises two contact chambers 10 and circuit board 8 two contact passage openings 12. However, contact elements 14, contact chambers 10, and contact passage openings 12 are not restricted to the number, shape, and arrangement shown and can be modified according to the respective application.

In order for the electrical plug connector 2 to be usable in high-voltage applications, the at least one contact element 14 can be configured as a high-voltage contact. In particular, the high-voltage contact can be configured to transmit electrical energy with alternating voltages above 30 V to 1 kV or with direct voltages above 60 V to 1.5 kV.

Seal 1 may be made of silicone, for example, vinyl-methyl-silicone (VMS), or other sealing material, the CTI (Comparative Tracking Index) of which exceeds a value of 600 and thereby reflects good insulation properties.

As shown in FIGS. 1 and 2, seal 1 comprises at least one passage opening 16 for receiving one of contact elements 14 each (see FIG. 3). The number of passage openings 16 can be adapted to the number of contact elements 14 that are required for the respective application. Alternatively, the number of seals 1 in electrical plug connector 2 can also be adapted accordingly. Seal 1 is shown in FIG. 1 purely by way of example with seven passage openings 16. In contrast, FIG. 2 shows several seals 1, each with one passage opening 16.

For each passage opening 16, a contact sealing section 18 of seal 1 extends in a sleeve-shaped manner along respective passage opening 16. Furthermore, for each passage opening 16, a creepage distance increase section 20 of said seal 1 is disposed opposite said contact sealing section 18.

In FIG. 1, respective creepage distance increase sections 20 continue associated passage opening 16 in axial direction 22 in a tubular manner. In FIG. 2, creepage distance increase sections 20 shown each extend in a plate-shaped manner from passage opening 16 in radial direction 24, perpendicular to the contact sealing section 18. Alternatively, respective creepage distance increase section 20 can also be configured to be rib-shaped, collar-shaped, ring-shaped, umbrella-shaped, and/or bell-shaped. Direction of extension 22, 24 and/or the shaping of respective creepage distance increase section 20 can also be varied within a seal 1 and adapted to the geometric conditions of electrical plug connector 2 (see FIG. 3).

Due to this shaping, seal 1 is suited to be installed in an electrical plug connector 2 in the context of its use and with its sleeve-shaped contact sealing sections 18 to seal any gaps 26 there that arise between contact elements 14 and housing 6 of electrical plug connector 2. To improve the sealing effect, seal 1 can comprise sealing lips 28 projecting radially inwardly and/or outwardly on contact sealing sections 18. This can be seen in FIGS. 2 and 3. Sealing lips 28 can furthermore function as press-on lips and establish or improve a frictionally engaged connection 30 between seal 1 and housing 6, contact element 14, and/or circuit board 8. The contact sealing section 18 can enclose the contact element 14 in sections.

At the same time, seal 1 is suited to insulate respective contact element 14 in interior 32 of housing 6 from circuit board 8 and all components 34 disposed on circuit board 8 by way of associated tubular or plate-shaped creepage distance increase section 20, as shown in FIG. 3; the circuit board 8 can be used as a carrier for the components 34. The seal 1 insulates the contact element 14 from other components having a different electrical potential by way of the tubular or plate-shaped creepage distance increase section 20. In particular, respective creepage distance increase section 20 lines associated contact passage opening 12 of circuit board 8 on the inside and thereby electrically insulates contact element 14 passing through from circuit board 8. The insulation of the at least one contact element 14 from the circuit board 8 is therefore equivalent to the insulation of the at least one contact element 14 from the components 34 having a different electrical potential. The at least one contact element 14 and the circuit board 8 can be built in a confined space without it being necessary to mill separating slots into the circuit board or to take similar precautions.

As a result of the functional integration of sealing and insulation in the seal 1, no separate insulation components need to be provided which would otherwise entail additional costs and material expenditure and would take up an unnecessarily large amount of installation space. Consequently, the present invention leads to savings in costs, material, and/or installation space. As an alternative to the integrally formed component, the electrical plug connector 2 can also comprise several individual seals 1 configured as sealing grommets or sealing elements.

As can be seen in radial section 36 shown in FIG. 2, plate-shaped creepage distance increase section 20 can comprise at least one depression 38 that is lowered or recessed in an axial direction 22. In particular, plate-shaped creepage distance increase section 20 can comprise at least one concave curvature 40 as depression 38. Concave curvature 40 in the exemplary embodiment shown is realized by an annular groove 42. Additionally or alternatively, plate-shaped creepage distance increase section 20 can comprise elevations or convex curvatures that in radial section 36 project in axial direction 22. The convex curvature can be realized by a bead, such as an annular bead. The elevations and/or depressions can be arranged with respect to passage opening 16 next to one another in radial direction 24, in particular alternately and form a meander 44. Outer face 46, in particular an end face 48, of creepage distance increase section 20 can be corrugated, grooved, or slotted, i.e. have a corrugation, groove or slot structure.

As indicated in FIG. 3, plate-shaped creepage distance increase section 20 is given meander 44 by annular groove 42, i.e. a meandering profile, at its outer face 46, in particular its end face 48. Consequently, a distance 50 extending along end face 48 between an outer edge 52 of end face 48 and an inner edge 54 of end face 48 exceeds spatial distance 56 between outer edge 52 and inner edge 54. Creepage distance 58 created is therefore longer than spatial extension 60 of creepage distance increase section 20. Tubular creepage distance increase section 20 also increases creepage distance 58 between circuit board 8 and associated contact element 14 in comparison to spatial distance 56 between circuit board 8 and associated contact element 14. This enables the implementation of comparatively long creepage distances 58 for the purpose of electrical insulation in a comparatively small installation space. The actually required length of the creepage distances 58 can be based on contractual, normative, and/or legal requirements.

Seal 1 shown in FIG. 1 comprises a sealing mat 62, where sealing mat 62 connects passage openings 16, contact sealing sections 18, and creepage distance increase sections 20 to form an integrated component 64. Contact sealing sections 18 and creepage distance increase sections 20 are there arranged in a manner each projecting out on opposite sides 66, 67 of sealing mat 62. The distance between the at least two passage openings 16 can then be defined with the aid of the sealing mat 62, which simplifies mounting the seal 1. An easily installable geometry of the seal 1 arises when the at least two passage openings 16 are parallel to one another and/or in one plane, in an embodiment in a plane of the sealing mat 62. The sealing mat 62 can optionally adjoin the creepage distance increase section 20 or the creepage distance increase sections 20 in the radial direction 24 with respect to the passage openings 16 and thereby contribute to the additional extension of the relevant creepage distances 58.

As shown in FIG. 3, sealing mat 62 can serve as a circuit board bed 68 which rests flat on circuit board 8 and is arranged between circuit board 8 and housing 6, for example, for the purpose of vibration protection. Creepage distance increase sections 20 each project into corresponding contact passage openings 12 of circuit board 8 or through corresponding contact passage openings 12 of circuit board 8 and line the latter on the interior. Contact sealing sections 18 again each project in sections into corresponding contact chambers 10 of housing 6.

Alternatively, seal 1 can also be configured as a sealing grommet which can be inserted into contact chamber 10 of housing 6 and into contact passage opening 12 of circuit board 8. Seal 1 configured as a sealing grommet can be held by way of said frictionally engaged connection 30 already mentioned above. Additionally or alternatively, seal 1 configured as a sealing grommet can comprise a fixation section which extends, for example, perpendicular to passage opening 16, radially inwardly into passage opening 16, and/or outwardly away from passage opening 16 and forms at least one undercut or two undercuts, respectively, that establish a positive-fit connection to housing 6, to at least one contact element 14, and/or to circuit board 8 of electrical plug connector 2. In this way, the seal 1 can be applied to the electrical plug connector 2 in a simple manner and, if necessary, also be removed again for maintenance or repair reasons. In order to obtain improved retention of the seal 1, the fixation section can be configured as an annular, in particular flange-shaped, fixation element. The fixation element can be formed, e.g. between the contact sealing section 18 and the creepage distance increase section 20.

Seals 1 shown in FIG. 2 do not have a sealing mat 62 or a fixation section but instead are each configured as a sealing element 70 which is injected into associated contact passage opening 12 of circuit board 8 and which forms a two-component assembly 72 with circuit board 8. Respective sealing element 70 can be connected in a positive substance-fit manner to circuit board 8, in particular at the former's creepage distance increase section 20. Due to the connection in a positive substance-fit manner, the fixation element can be dispensed with in this embodiment. Consequently, no undercuts are required to retain the seal 1, so that the seal 1 can be configured to be thinner, in particular with less material. In an embodiment, the respective creepage distance increase section 20 extends flush with circuit board 8. Since respective creepage distance increase section 20 comprises only one annular groove 42 and no elevations, seal 1 does not project on one side 74 of circuit board 8 beyond circuit board 8. On the other, oppositely disposed side 76 of circuit board 8, respective contact sealing section 18 is formed onto corresponding creepage distance increase section 20.

It is shown in FIG. 3 that circuit board 8 of electrical plug connector 2 can comprise at least one temperature sensor 78 for monitoring the operating temperature of at least one contact element 14, where a heat-conducting bridge 80 is arranged in seal 1 and is disposed between said at least one contact element 14 and said temperature sensor 78. Heat-conducting bridge 80 can be configured, for example, as a copper element 82 or as an element made of different metal material and is inserted into seal 1 or injection-mold-coated by seal 1. The higher thermal conductivity of the metal material compared to the sealing material can thereby accelerate the heat transport from the at least one contact element 14 to the temperature sensor 78 at least in sections, so that fewer measurement delays arise. As a result, overheating of the at least one contact element 14 can be recognized more quickly and responded to more quickly. This is of great importance, inter alia, for high-voltage applications. Creepage distance 84 between heat-conducting bridge 80 and at least one contact element 14 is also increased due to seal 1.

As shown in FIGS. 4 and 5, at least one contact element 14 can be locked in contact chamber 10 of housing 6. For this purpose, electrical plug connector 2 comprises a contact lock element 86 as a contact lock 88. Contact lock element 86 is configured as a separate component that can be attached to housing 6. In particular, contact lock element 86 and housing 6 can be configured to be plugged to one another by mutual relative displacement 90. As a result of relative displacement 90, contact lock element 86 is attached to housing 6 and rests on a stop surface 92 of at least one contact element 14, preventing the contact element 14 from being pulled out unintentionally from the contact chamber 10. For this purpose, at least one contact element 14 can comprise a radial shoulder 94 which forms stop surface 92. In the embodiment shown, stop surface 92 and therefore also direction of relative displacement 90 extend parallel to circuit board 8.

In order to ensure compliance with the necessary air and creepage distances also at contact lock element 86, contact lock element 86 rests only on stop surface 92 of at least one contact element 14 in state 96 when attached to housing 6 (see FIG. 5), but touches neither circuit board 8 nor creepage distance increase section 20 of seal 1. This is accomplished in that contact lock element 86 can comprise for each contact element 14 of electrical plug connector 2 to be locked a horseshoe-shaped foot 98 which engages in part around respective contact element 14 and rests on associated stop surface 92. The remainder of contact lock element 86 is at a sufficient distance from circuit board 8 as well as from creepage distance increase section 20 of seal 1, as shown in FIG. 5.

Furthermore, it can be seen in FIGS. 4 and 5 that stop surface 92 of at least one contact element 14 extends flush with circuit board 8 and in particular does not project out beyond circuit board 8 on side 74 of circuit board 8. Since creepage distance increase section 20 of seal 1 does not project out beyond circuit board 8 on this side 74 of circuit board 8, as already described, contact lock element 86, in particular horseshoe-shaped foot 98 of contact lock element 86, can be moved past circuit board 8 and creepage distance increase section 20 of seal 1 without hindrance during relative displacement 90. This is indicated in FIG. 4 by dashed lines 100.

In addition, electrical plug connector 2 can comprise a further contact lock device 88 which is realized by a latching projection 104 extending in contact chamber 10 of housing 6 and monolithically connected to housing 6 (see FIGS. 4 and 5). Latching projection 104 is flexible and hook-shaped and engages in a recess 106 of at least one contact element 14 in order to create an additional positive-fit connection 108 between latching projection 104 and at least one contact element 14.

FIGS. 4 and 5 show electrical plug connection assembly 4 according to the invention with an electrical plug connector 2 and with a mating connector 110 configured to be complementary to electrical plug connector 2. In particular, electrical plug connector 2 and mating connector 110 are configured to be plugged together along a plugging direction 112.

In the greatly simplified representation shown in FIGS. 4 and 5, mating connector 110 comprises a mating contact 114 which is shaped to be complementarily to contact element 14 of electrical plug connector 2. Furthermore, mating connector 110 comprises a signal contact 116 which is configured to be connectable to circuit board 8. In particular, when electrical plug connection assembly 4 is in the state plugged together, signal contact 116 can contact circuit board 8 directly or be connected to circuit board 8 by way of an intermediate contact that is arranged on housing 6 of electrical plug connector 2 and soldered to circuit board 8.

Of course, mating connector 110 can differ from the greatly simplified illustration of FIGS. 4 and 5 with regard to the number, shape, and arrangement of its mating contacts 114 and signal contacts 116 and be adapted to its particular application. In particular, mating connector 110 can comprise a mating contact 114 for each contact element 14 of electrical plug connector 2 and a signal contact for each intermediate contact of electrical plug connector 2.

What is claimed is:
1. A seal for an electrical plug connector, comprising:
   a plurality of passage openings each receiving a contact element; and
   a sealing mat connecting the plurality of passage openings, each of the passage openings has a contact sealing section extending along the passage opening in a sleeve-shaped manner and a creepage distance increase section disposed opposite the contact sealing section, the creepage distance increase section of at least one of the plurality of passage openings continues the passage opening in a tubular manner on a side of the sealing mat opposite the contact sealing section with a height of the creepage distance increase section above the sealing mat greater than a height of the contact sealing section below the sealing mat, and the creepage distance increase section of a second one of the plurality of passage openings extends away from the second one of the plurality of passage openings in a radial direction in a plate-shaped manner having a meander with a same height as an upper surface of the contact sealing section.

2. The seal of claim 1, further comprising a fixation section retaining the seal at the electrical plug connector.

3. The seal of claim 1, wherein the sealing mat adjoins the creepage distance increase section in a radial direction with respect to the passage openings.

4. The seal of claim 1, wherein the passage openings are disposed in a plane.

5. The seal of claim 1, wherein the creepage distance increase section extends away from the passage opening in the plate-shaped manner and has a plurality of elevations that, in a radial section, project in an axial direction with respect to the passage opening.

6. The seal of claim 5, wherein the creepage distance increase section has a plurality of depressions that are recessed in the axial direction.

7. The seal of claim 6, wherein the elevations and/or the depressions are arranged with respect to the passage opening next to one another in a radial direction and form the meander.

8. An electrical plug connector, comprising:
a seal including a passage opening receiving a contact element, a contact sealing section extending along the passage opening in a sleeve-shaped manner, and a creepage distance increase section disposed opposite the contact sealing section, the creepage distance increase section continues the passage opening in a tubular manner and/or extends away from the passage opening in a plate-shaped manner;
a housing having a contact chamber;
a circuit board arranged on the housing; and
a contact element disposed in the contact chamber and extending through a contact passage opening of the circuit board, the contact sealing section seals a gap between the housing and the contact element, the creepage distance increase section lines the contact passage opening of the circuit board and electrically insulates the contact element from the circuit board.

9. The electrical plug connector of claim 8, wherein the seal is a sealing element injected into the contact passage opening, the seal forms a two-component assembly with the circuit board.

10. The electrical plug connector of claim 8, wherein the contact element is a high-voltage contact.

11. An electrical plug connection assembly, comprising:
an electrical plug connector according to claim 8; and
a mating connector complementary to the electrical plug connector, the mating connector has a mating contact shaped complementary to the contact element and a signal contact connected to the circuit board.

12. The electrical plug connector of claim 8, wherein the circuit board has a temperature sensor monitoring an operating temperature of the contact element.

13. The electrical plug connector of claim 12, wherein a heat-conducting bridge is arranged in the seal and is disposed between the contact element and the temperature sensor.

14. The electrical plug connector of claim 8, further comprising a contact lock element attached to the housing.

15. The electrical plug connector of claim 14, wherein the contact element has a shoulder with a stop surface extending flush with the circuit board.

16. The electrical plug connector of claim 15, wherein the contact lock element rests on the stop surface in a state attached to the housing.

* * * * *